(12) United States Patent
Lindblad et al.

(10) Patent No.: US 9,155,235 B2
(45) Date of Patent: Oct. 6, 2015

(54) TILT MECHANISM FOR A DISPLAY

(71) Applicant: Ergotron, Inc., St. Paul, MN (US)

(72) Inventors: Shaun C. Lindblad, Lino Lakes, MN (US); Joe Funk, St. Paul, MN (US); Mustafa A. Ergun, Plymouth, MN (US)

(73) Assignee: Ergotron, Inc., St. Paul, MN (US)

( * ) Notice: Subject to any disclaimer, the term of this patent is extended or adjusted under 35 U.S.C. 154(b) by 65 days.

(21) Appl. No.: 13/754,428

(22) Filed: Jan. 30, 2013

(65) Prior Publication Data

US 2013/0200240 A1 Aug. 8, 2013

Related U.S. Application Data

(60) Provisional application No. 61/594,679, filed on Feb. 3, 2012.

(51) Int. Cl.
*H05K 13/00* (2006.01)
*F16M 13/02* (2006.01)
(Continued)

(52) U.S. Cl.
CPC .............. *H05K 13/0015* (2013.01); *F16F 3/04* (2013.01); *F16M 11/10* (2013.01); *F16M 11/2021* (2013.01); *F16M 11/24* (2013.01); *F16M 13/022* (2013.01); *G06F 1/1601* (2013.01);
(Continued)

(58) Field of Classification Search
CPC ........ F16F 3/04; H05K 13/0015; F16M 1/10; F16M 11/2021; F16M 11/24; F16M 2200/041; F16M 2200/044; F16M 13/022; G06F 1/1601
USPC ............ 248/123.11, 371, 372.1, 292.11, 608, 248/625, 919, 921, 923; 16/305, 307, 340, 16/342, 277, 308, 377; 361/679.02, 361/679.27, 807, 681–683; 267/155, 168, 267/180, 166
See application file for complete search history.

(56) References Cited

U.S. PATENT DOCUMENTS 2,481,037 A * 9/1949 Pringle .......................... 254/340
4,869,459 A    9/1989 Bourne
(Continued)

FOREIGN PATENT DOCUMENTS

JP         1224599 A    9/1989
KR      20100044003 A   4/2010

OTHER PUBLICATIONS

"International Application Serial No. PCT/US2013/023862, International Preliminary Report on Patentability mailed Aug. 14, 2014", 8 pgs.

(Continued)

*Primary Examiner* — Tan Le
(74) *Attorney, Agent, or Firm* — Schwegman Lundberg & Woessner, P.A.

(57) ABSTRACT

Embodiments provide a tilt mechanism for tilting an electronic display that includes at least two nested torsion springs to offset and/or balance the torque generated by a display acting on the tilt mechanism. In some cases a tilt mechanism includes first and second brackets pivotally coupled about a tilt axis. First and second springs are wound about a tilt axis such that the first spring is located at least partially within the second spring. The springs engage with the brackets to exert first and second torques between the first and the second brackets. In some cases such tilt mechanisms can be carried by stands, arms, carts, and the like. Methods of tilting electronic displays are also provided.

14 Claims, 9 Drawing Sheets

(51) Int. Cl.
  *F16M 11/10* (2006.01)
  *F16M 11/24* (2006.01)
  *F16F 3/04* (2006.01)
  *F16M 11/20* (2006.01)
  *G06F 1/16* (2006.01)

(52) U.S. Cl.
  CPC ..... *E05Y2900/606* (2013.01); *F16M 2200/041* (2013.01); *F16M 2200/044* (2013.01)

(56) References Cited

U.S. PATENT DOCUMENTS

| | | | |
|---|---|---|---|
| 5,197,704 A * | 3/1993 | Kitamura | 248/292.11 |
| 6,122,862 A | 9/2000 | Hoermann | |
| 6,220,586 B1 * | 4/2001 | Pavlin et al. | 267/155 |
| 6,382,577 B1 | 5/2002 | McCoy | |
| 6,446,308 B1 * | 9/2002 | Brewington et al. | 16/337 |
| 7,252,277 B2 | 8/2007 | Sweere | |
| 7,506,853 B2 | 3/2009 | Sweere | |
| 7,887,014 B2 | 2/2011 | Lindblad | |
| 8,286,927 B2 | 10/2012 | Sweere | |
| 8,381,356 B2 * | 2/2013 | Chen | 16/305 |
| 2002/0092129 A1 | 7/2002 | Brewington | |
| 2007/0252056 A1 | 11/2007 | Novin | |
| 2011/0278424 A1 * | 11/2011 | Theis et al. | 248/608 |
| 2012/0005860 A1 | 1/2012 | Chen | |
| 2012/0187056 A1 | 7/2012 | Hazzard | |

OTHER PUBLICATIONS

International Search Report and Written Opinion, dated May 28, 2013 for PCT Application No. PCT/US2013/023862, 11 pages.

* cited by examiner

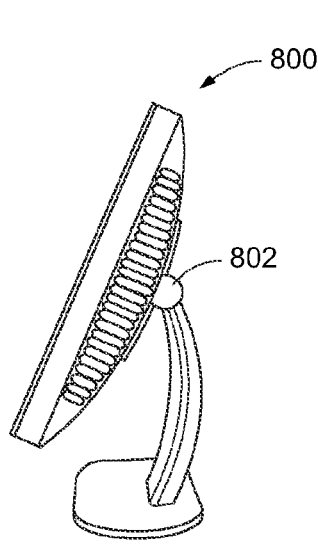
Fig. 8A
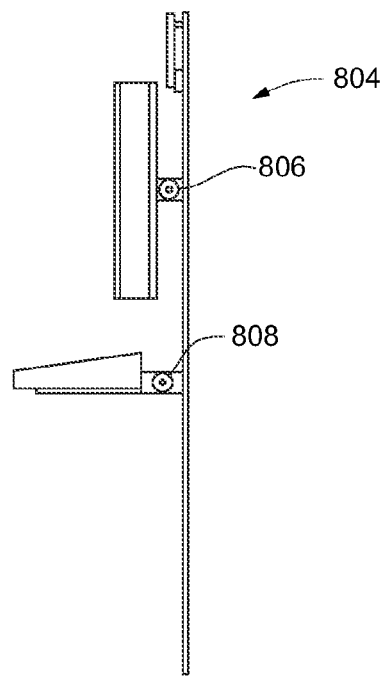
Fig. 8B
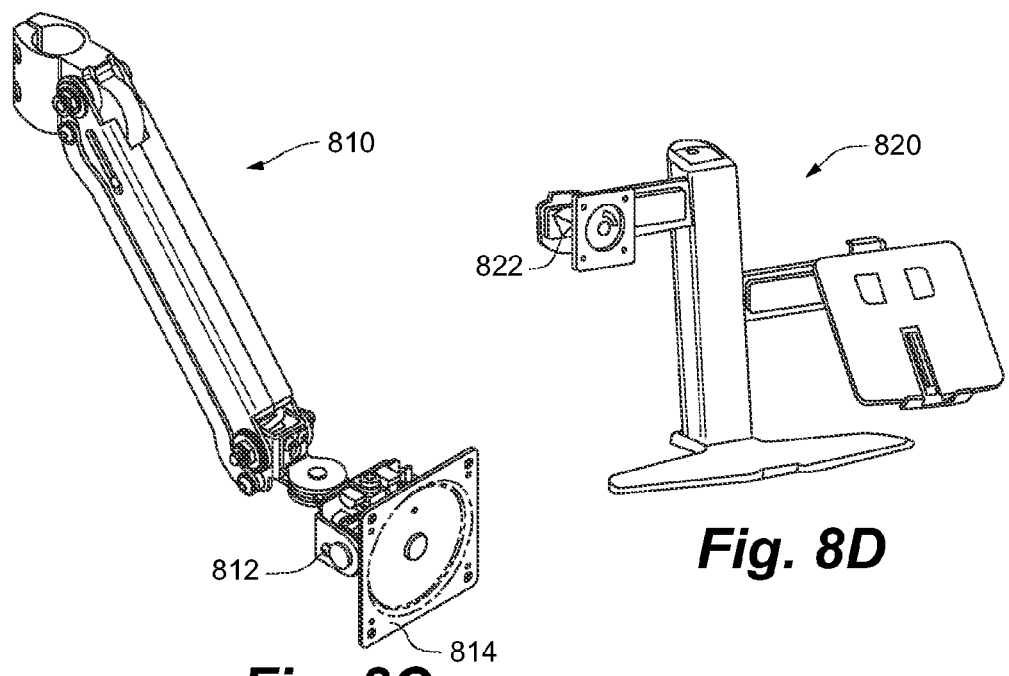
Fig. 8C
Fig. 8D

TILT MECHANISM FOR A DISPLAY

CROSS-REFERENCES

This application claims the benefit of U.S. Provisional Application No. 61/594,679, filed Feb. 3, 2012, the content of which is hereby incorporated by reference in its entirety.

FIELD

This disclosure generally relates to systems and methods incorporating tilt mechanisms for electronic displays.

BACKGROUND

Tilt mechanisms are used to adjust a tilt angle of an electronic display to provide ergonomic viewing options for a user. In some cases a tilt mechanism may also be referred to as a tilt, a pivot, or a pivot mechanism. In general, a tilt mechanism provides an angular range of motion about a tilt or pivot axis. A tilt mechanism can thus be coupled to an electronic display to allow an user to adjust the display's tilt angle. Tilt mechanisms usually also include some type of mechanism to maintain the desired tilt angle against the weight of the electronic display. Some tilt mechanisms provide a force that offsets some or all of the torque created by the weight of the electronic display about the tilt axis. Such a force can allow a user to more easily move an electronic display through the available angular range of motion.

SUMMARY

Embodiments of the invention provide a tilt mechanism for tilting an electronic display. In some embodiments, the tilt mechanism includes a spring assembly with more than one (e.g., two) concentric springs. Such embodiments can in some cases balance or at least offset a torque generated by a display held by the tilt mechanism while maintaining the tilt mechanism in a relatively small volume. In some cases such tilt mechanisms can be carried by stands, arms, carts, and the like.

According to one embodiment, a tilt mechanism for tilting an electronic display is provided. The tilt mechanism includes first and second brackets pivotally coupled about a tilt axis. At least one of the first and the second brackets is configured to be coupled to an electronic display. The tilt mechanism also includes a first spring and a second spring. The first spring is wound about the tilt axis while the second spring is wound about the first spring and the tilt axis such that the first spring is located at least partially within the second spring. The first spring and the second spring each include a first end that is engaged with the first bracket and a second end that is engaged with the second bracket. The first spring exerts a first torque between the first and the second brackets in a first direction about the tilt axis and the second spring exerts a second torque between the first and the second brackets also in the first direction about the tilt axis.

According to another embodiment, an apparatus is provided that includes an electronic display mount configured to couple to and support an electronic display, a support member for supporting the electronic display mount with respect to a support surface, and a tilt mechanism coupled between the electronic display mount and the support member. The tilt mechanism comprises a first bracket coupled to the electronic display mount and a second bracket coupled to the support member. The second bracket is also pivotally coupled to the first bracket about a tilt axis. The tilt mechanism also includes a first spring and a second spring. The first spring is wound about the tilt axis and comprises a first end engaged with the first bracket and a second end engaged with the second bracket, thereby exerting a first torque between the first and the second brackets in a first direction about the tilt axis. The second spring is wound about the first spring and the tilt axis such that the first spring is located at least partially within the second spring. The second spring includes a first end engaged with the first bracket and a second end engaged with the second bracket, and thus the second spring exerts a second torque between the first and the second brackets in the first direction about the tilt axis.

Another embodiment of the invention provides a method for tilting an electronic display coupled to a support member by a tilt mechanism. The method includes moving the electronic display in a first direction about a tilt axis. Moving the display in the first direction includes rotating a first tilt bracket and loading first and second springs. The first tilt bracket is coupled to the electronic display and provides a first angular range of motion about the tilt axis with respect to a second tilt bracket coupled to the support member. The first spring is wound about the tilt axis and is loaded with a first torque corresponding to a first portion of the electronic display's weight. The second spring is wound about the first spring and the tilt axis, such that the first spring is located at least partially within the second spring. The second spring is loaded with a second torque corresponding to a second portion of the electronic display's weight. According to some embodiments moving the display in the first direction can include tilting and/or translating the display with respect to the tilt axis.

These and various other features and advantages will be apparent from a reading of the following detailed description.

BRIEF DESCRIPTION OF THE DRAWINGS

The following drawings illustrate some particular embodiments of the present invention and therefore do not limit the scope of the invention. The drawings are not to scale (unless so stated) and are intended for use in conjunction with the explanations in the following detailed description. Some embodiments will hereinafter be described in conjunction with the appended drawings, wherein like numerals denote like elements.

FIGS. 8A-8D are views of multiple display positioning devices in accordance with multiple embodiments of the invention.

DETAILED DESCRIPTION

The following detailed description is exemplary in nature and is not intended to limit the scope, applicability, or configuration of the invention in any way. Rather, the following description provides some practical illustrations for implementing some embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

Figure 1:
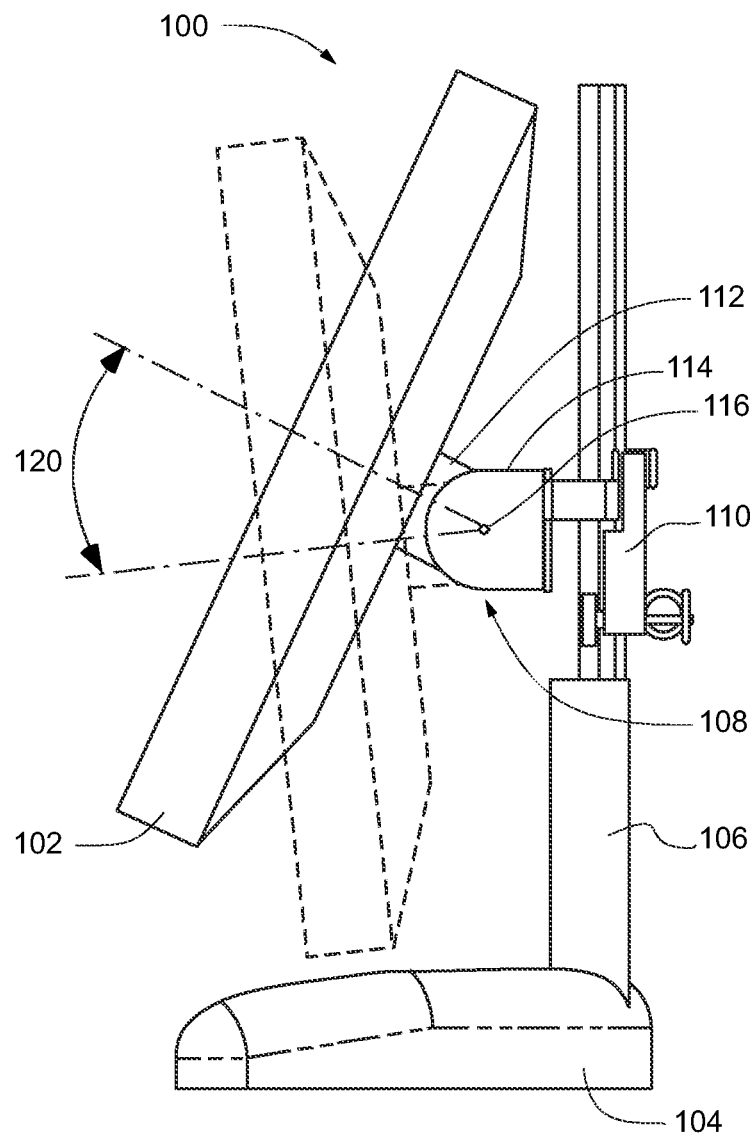
FIG. 1 is a side view of an electronic display stand in accordance with an embodiment of the invention.

FIG. 1 is a side plan view of an electronic display stand 100 supporting an electronic display 102 according to one possible embodiment of the invention. The display stand 100 generally includes a base 104, a support column 106 extending up from the base 104, and a tilt mechanism 108 coupled between the electronic display 102 and the support column 104. In this embodiment the display stand 100 also includes a lift mechanism 110 that provides vertical adjustment of the display 102 with respect to the support 106 and base 104.

The tilt mechanism 108 is formed in this embodiment with a first bracket 112 and a second bracket 114 that are pivotally coupled to a shaft (not shown) such as a bolt or rod that defines a tilt axis 116 for the first and/or second bracket to pivot about. The first bracket 112 is coupled (indirectly) to the electronic display 102 through an electronic display mount (not shown), such as a VESA interface or any other useful mount configured to couple to and support an electronic display. The second bracket 114 is coupled to the lift mechanism 110, and thus also the support column 104 and the base 102. As shown in FIG. 1, the first bracket 112 is rotatable with respect to the second bracket 114 through an angular range of motion 120 about the tilt axis 116. As shown in FIG. 1, in this case the range of motion 120 is about 30 degrees about the tilt axis 116.

Accordingly, the tilt mechanism 108 generally allows a user to tilt the electronic display 102 back and forward about the tilt axis 116 with respect to the display stand 100 in order to provide a number of viewing orientations of the display 102. An example of one possible tilt mechanism embodiment that can be used with the display stand 100 and/or other types of display positioning devices will be further described with respect to FIGS. 2-6.

Some embodiments of the invention generally provide a tilt mechanism and/or a method of tilting, such as one of those described herein. Some embodiments provide an apparatus or device capable of positioning various equipment relative to a human operator, the apparatus incorporating such a tilt mechanism to provide a tilting function for the operator. For example, in some cases a positioning apparatus can support items such as electronic displays (e.g., the display stand shown in FIG. 1), a laptop computer (i.e., notebook), a keyboard, other computing equipment, such as a mouse, and/or other types of equipment including work surfaces. Additional examples of display positioning devices that can incorporate a tilt mechanism will be discussed with respect to FIGS. 8A-9D along with various methods for tilting an electronic display. As used herein, the term electronic display is used to refer to televisions, computer monitors, tablet computers, smart phones, and other types of displays capable of displaying images from electronic signals.

Figure 2:
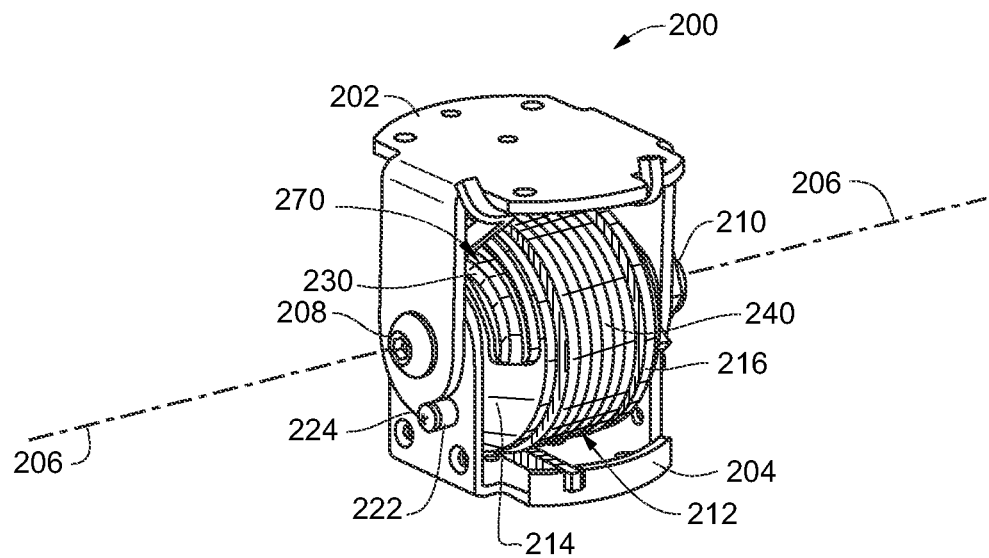
FIG. 2 is a perspective view of a tilt mechanism in a first tilt orientation in accordance with an embodiment of the invention.
Figure 3:
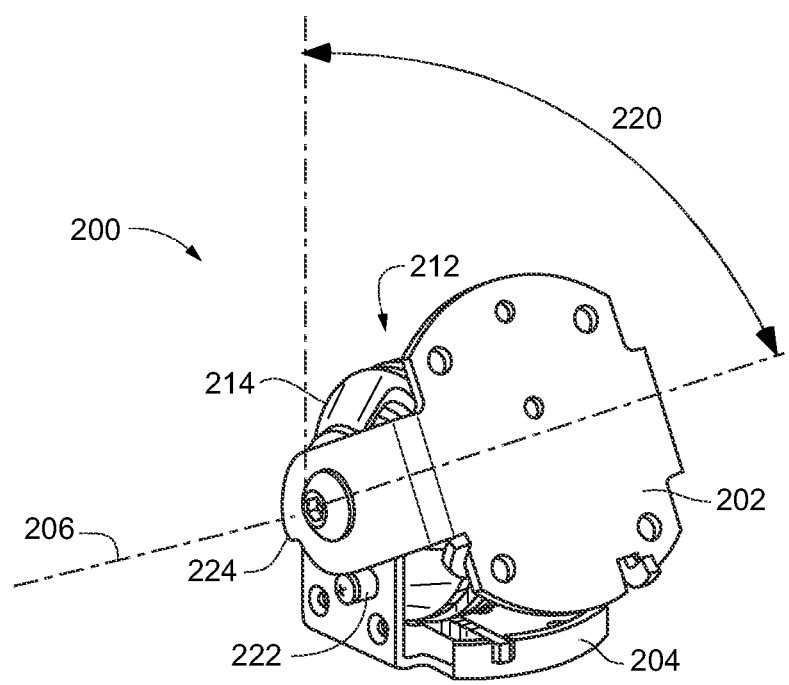
FIG. 3 is a perspective view of the tilt mechanism of FIG. 2 in a second tilt orientation in accordance with the embodiment.

Turning now to FIGS. 2-6, one possible embodiment of a tilt mechanism 200 will be described. FIGS. 2 and 3 are perspective views of the tilt mechanism 200 in accordance with the embodiment. As shown, the tilt mechanism 200 generally includes a first mounting bracket 202 and a second mounting bracket 204 that are pivotally coupled to a shaft that extends along and is generally coaxial with a tilt axis 206 of the mechanism 200. In this example the shaft is formed by a bolt 208 and fastened with a nut 210 to hold the first and the second mounting brackets together on the shaft. The tilt mechanism 200 also includes a spring assembly 212 including at least two springs positioned about the tilt axis 206 within the mounting brackets. The spring assembly 212 engages the mounting brackets 202, 204, generating rotational forces about the tilt axis that act on the brackets.

A first side bracket 214 and a second side bracket 216 are positioned on either side of the spring assembly 212 and generally provide an interface between the springs in the assembly and the first and the second mounting brackets 202, 204. Thus, in this embodiment the bolt 208, the nut 210, and the two side brackets 214, 216 can be used to hold the tilt mechanism 200 together and desirably space and locate the spring assembly 212 within the first and the second mounting brackets 202, 204. Other types of shafts including, but not limited to rods, screws, nails, and/or integral portions of the one or both brackets 202, 204 could also be used. In addition, in some cases the side brackets may be provided with a different form and/or side brackets may be considered optional or may not be provided.

Referring to FIG. 3, the pivotal coupling of the first and second mounting brackets about the tilt axis 206 provides an angular range of motion 220 between the two mounting brackets, along with a corresponding amount of tilt adjustment for any equipment coupled to the mounting brackets. The angular range of motion 220 can be any amount of rotation suitable for a desired implementation. In some embodiments the angular range of motion 220 is less than one rotation about the tilt axis 206, which in many cases is sufficient for display tilting applications. In some embodiments the angular range of motion 220 is equal to or less than about 90 degrees.

Continuing with reference to FIG. 3, in this embodiment the angular range of motion 220 is less than 90 degrees and generally about 45 degrees of rotation about the tilt axis 206. Various mechanisms can be used to define and/or limit the range of motion 220. As shown in FIG. 2, in this embodiment the second mounting bracket 204 includes a peg 222 and the first mounting bracket 202 includes a detent 224 that engages the peg 222 to define one extent of the range of motion 220. FIG. 3 illustrates how in some cases a side edge of the first bracket 202 can also engage the peg 222 to define a second extent of the range of motion 220.

Referring back to FIG. 2, the first and second mounting brackets 202, 204 are configured in a first tilt orientation corresponding to the extent of the range of motion defined by the peg 222 and detent 224. FIG. 3 shows the first and second mounting brackets in a second tilt orientation corresponding to the second range extent determined by the peg 222 and the side of the first bracket 202. In this embodiment the tilt mechanism 200 generally provides an infinite number of tilt orientations located between these two extents, made possible by a freely rotatable/pivotable coupling between one or more of the mounting brackets and the bolt 208 and the infinitesimally small adjustments made possible by the nature of the springs in the spring assembly 212. In some embodiments, though, a discrete number of tilt orientations may instead be provided.

Figure 4:
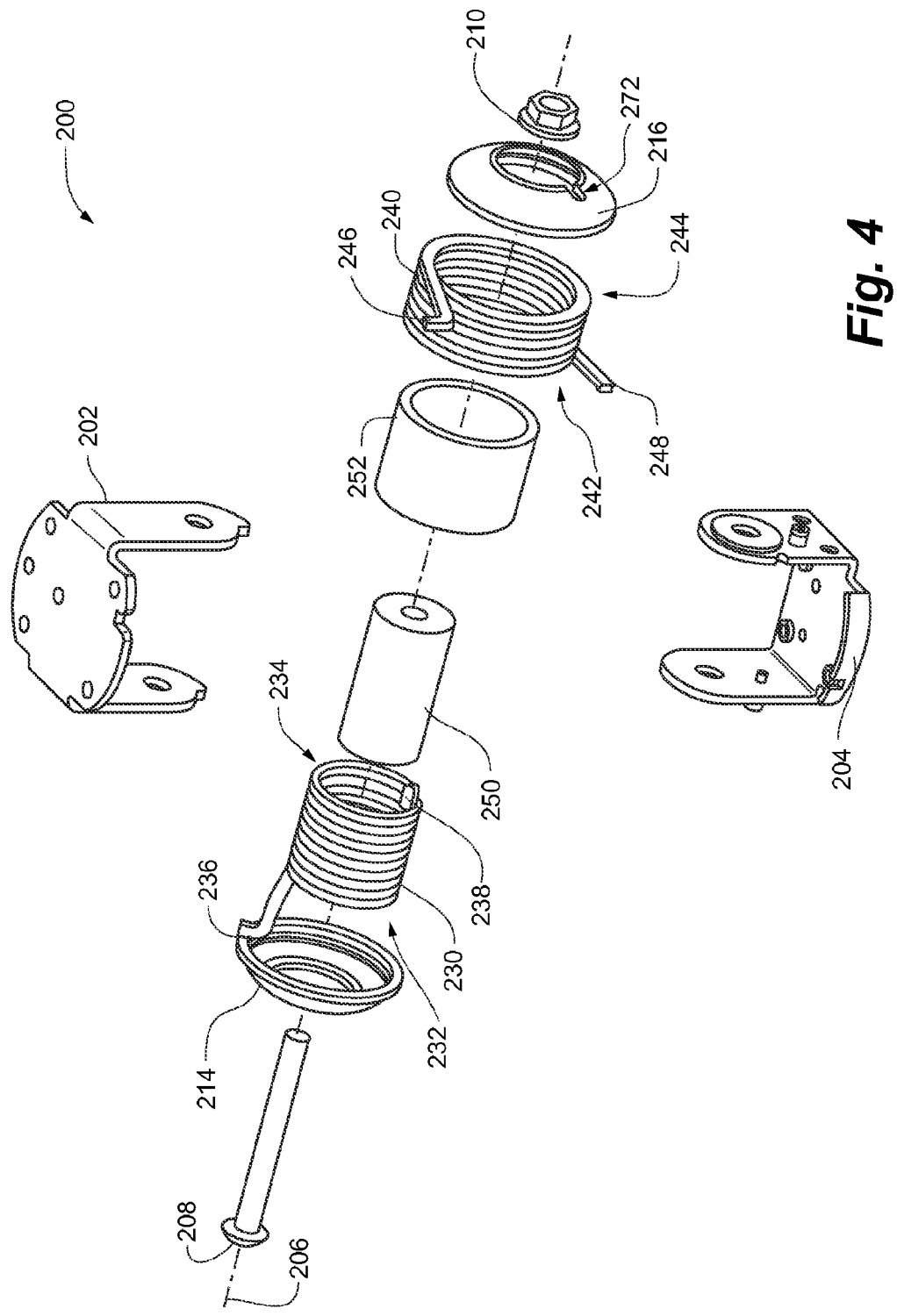
FIG. 4 is an exploded perspective view of the tilt mechanism of FIG. 2 in accordance with the embodiment.

FIG. 4 is an exploded perspective view of the tilt mechanism 200 that illustrates the spring assembly 212 and other parts of the tilt mechanism in greater detail. In this embodiment the spring assembly 212 includes a first spring 230 and a second spring 240, though it is contemplated that in some embodiments a spring assembly could include more than two springs. As shown in FIG. 4, in this embodiment the first and second springs 230, 240 are formed as helical torsion springs that include a number of windings or coils extending about the tilt axis. Each spring 230, 240 generally includes a first axial end 232, 242, a second axial end 234, 244, a first spring end 236, 246, and a second spring end 238, 248. As shown in FIGS. 2, 3, 5, and 6, the first and second spring ends of the springs engage the first and second mounting brackets 202, 204 when the tilt mechanism is assembled.

The views of the assembled tilt mechanism 200 also depict how the first spring 230 is wound about the tilt axis 206 and the second spring 240 is wound about the tilt axis 206 and the first spring 230 in the assembled state. In this configuration the first spring 230 is located within and extends through the interior of the second spring 240 in a type of nested spring configuration. It can be seen more clearly in FIG. 4 (exploded assembly view) and FIG. 5 (front plan view) that in this case the first spring 230 has a greater axial length than the second spring 240, though some embodiments may include a different combination of springs with different axial lengths.

Figure 6:
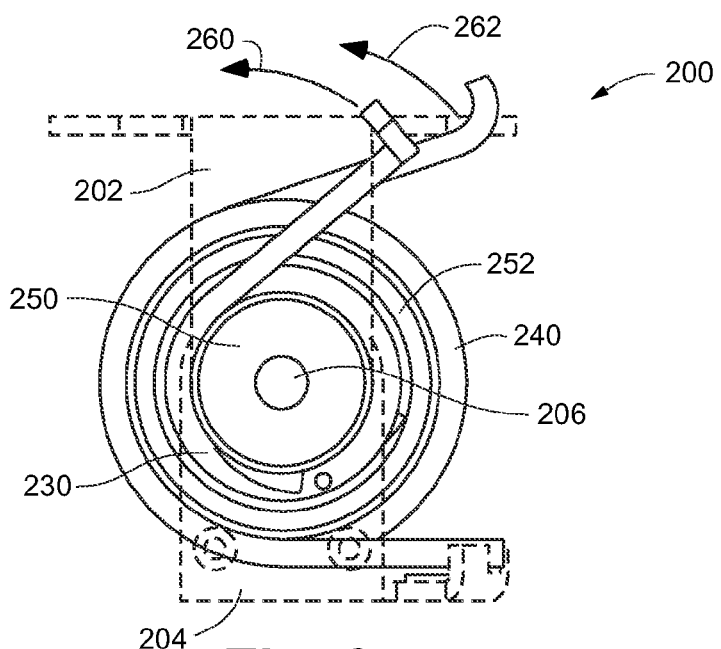
FIG. 6 is a side plan view of the tilt mechanism of FIG. 2 in the first tilt orientation in accordance with the embodiment.

FIG. 6 is a side plan view of the tilt mechanism 200. As shown, the first spring 230 and the second spring 240 are wound about the tilt axis 206 in the sense that the first and second springs are concentrically positioned about the tilt axis 206. Thus, both the first and the second springs are coaxial with the tilt axis, with the smaller diameter first spring 230 nested within the larger diameter second spring 240. In this embodiment, the tilt mechanism 200 also includes an inner first mandrel 250 and an outer second mandrel 252 that position the first and the second spring in the concentric relationship about the tilt axis 206. The mandrels 250, 252 can be formed from any suitable material such as plastic, metal, a composite, and the like.

Returning to FIG. 4, the inner mandrel 250 has a cylindrical configuration that slides over the shaft of the bolt 208 and is located within the interior of the first spring 230. The second mandrel 252 has a cylindrical configuration with a larger core than the first mandrel and is located between the outer diameter of the first spring 230 and the inner diameter of the second spring 240. During assembly, the second mandrel's core slips over and around the outer diameter of the first spring 230, and provides an exterior surface that receives the second spring 240. During operation of the tilt mechanism 200, the first and second mandrels 250, 252 can generally maintain the positions of the springs about the tilt axis 206, limit the springs' deformation, and/or limit tangling between the windings of the two springs.

While this embodiment utilizes mandrels along with a concentric nested spring configuration, it should be appreciated that some embodiments may not include an inner mandrel, an outer mandrel, and/or a concentric configuration. For example, in one embodiment without the optional mandrels, the first and the second springs may be parallel, but not coaxial, with the tilt axis 206. In addition, the axes of the two springs may be parallel but not coaxial. Further, the springs may in some cases deform when the brackets 202, 204 are tilted through the angular range of motion 220 without the mandrels holding the springs in place. Thus, each spring axis may move toward or away from the tilt axis 206 during tilting of the mechanism.

Returning to FIG. 4, each of the first and second mounting brackets 202, 204 are provided in a generally U-shaped form including side arms that couple to the bolt 208 and an attachment plate connecting the side arms at a distance away from the bolt/tilt axis. Each of the mounting brackets is configured to be coupled to other structures, in this embodiment through the use of one or more mounting holes in the attachment plate and/or side arms of each bracket. For example, in some cases one of the mounting brackets may be configured to be coupled to an electronic display. The other mounting bracket can be configured to be coupled with a support member, such as a support arm, a base, a support column, or other structural member. As used herein, the terms couple and coupled are meant to include both direct attachment between a mounting bracket and some other structure and an indirect attachment between the mounting bracket and the other structure via one or more other structures. As just one example, the first mounting bracket 202 in this example is configured be coupled to an electronic display such as the display 102 shown in FIG. 1. In some cases the coupling may be a direct attachment between the bracket and the back surface of the display, while in other cases the coupling may be an indirect attachment through a display mount such as a VESA interface and/or one or more other structural supports, such as a support arm extending from the tilt mechanism, the support arm itself being attached to a display with a display mount.

Figure 5:
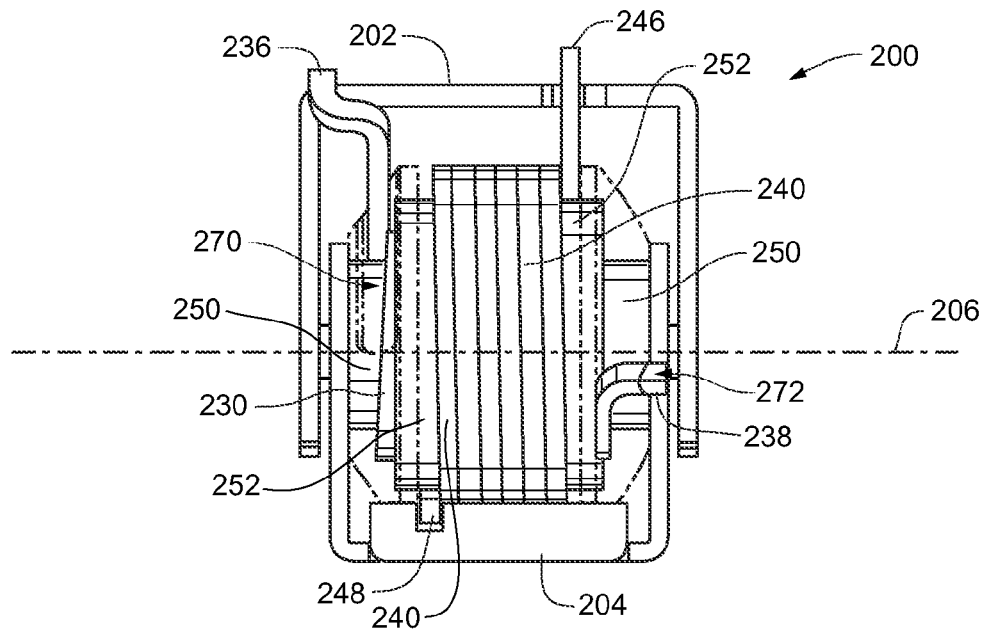
FIG. 5 is a front plan view of the tilt mechanism of FIG. 2 in the first tilt orientation in accordance with the embodiment.

FIG. 4 also illustrates notches in both the first mounting bracket 202 and the second mounting bracket 204 for engaging with the first and the second springs. As shown in FIG. 5, the first spring ends 236, 246 of the springs are directly engaged with the notches at the edge of the first bracket's attachment plate. The second spring end 248 of the second spring 240 is directly engaged with the attachment plate of the second mounting bracket 204, while the second spring end 238 of the first spring 230 is directly engaged with a side arm of the second mounting bracket 204. Thus, the engagement of the first spring 230 with the brackets 202, 204 exerts a first torque 260 between the first and the second brackets, the torque 260 being in a first direction about the tilt axis 206, which is counter clockwise as shown in FIG. 6. Likewise, the engagement of the second spring 240 with the brackets 202, 204 exerts a second torque 262 between the first and the second brackets, the second torque 262 being in a second direction about the tilt axis 206, which in this example is also counter clockwise, the same direction as the first direction, as shown in FIG. 6.

As shown in FIG. 5, the first side bracket 214 and the second side bracket 216 are positioned about the tilt axis 206 proximate the first and second axial ends of the first and second springs, respectively. As seen in FIG. 4, the first and second side brackets 214, 216 in the depicted embodiment are generally formed with a conical outer wall and a multi-step interior wall designed to engage and partially fit snugly over the ends of the first mandrel 250, the first spring 230, the second mandrel 252, and contact the ends of second spring 240. The side brackets thus sandwich the spring assembly 212, holding the mandrels and springs together between the first and second mounting brackets. FIG. 5 shows this arrangement with the side brackets displayed in outline only to more easily view the engagement described above.

According to some embodiments, such as the example depicted in FIGS. 2-6, one or more side brackets can include an aperture to enable one or both of the first and second springs to engage with the first and/or second mounting brackets. For example, as shown in FIGS. 2 and 5, the first side bracket 214 includes a curved opening 270 through which the first end 236 of the first spring 230 extends prior to engaging with the first mounting bracket 202. As shown in FIGS. 4 and 5, in this example the second side bracket 216 includes a small aperture in the form of a notch 272 in the interior edge of the bracket through which the second end 238 of the first spring 230 extends prior to engaging with the second bracket 204.

Figure 7:
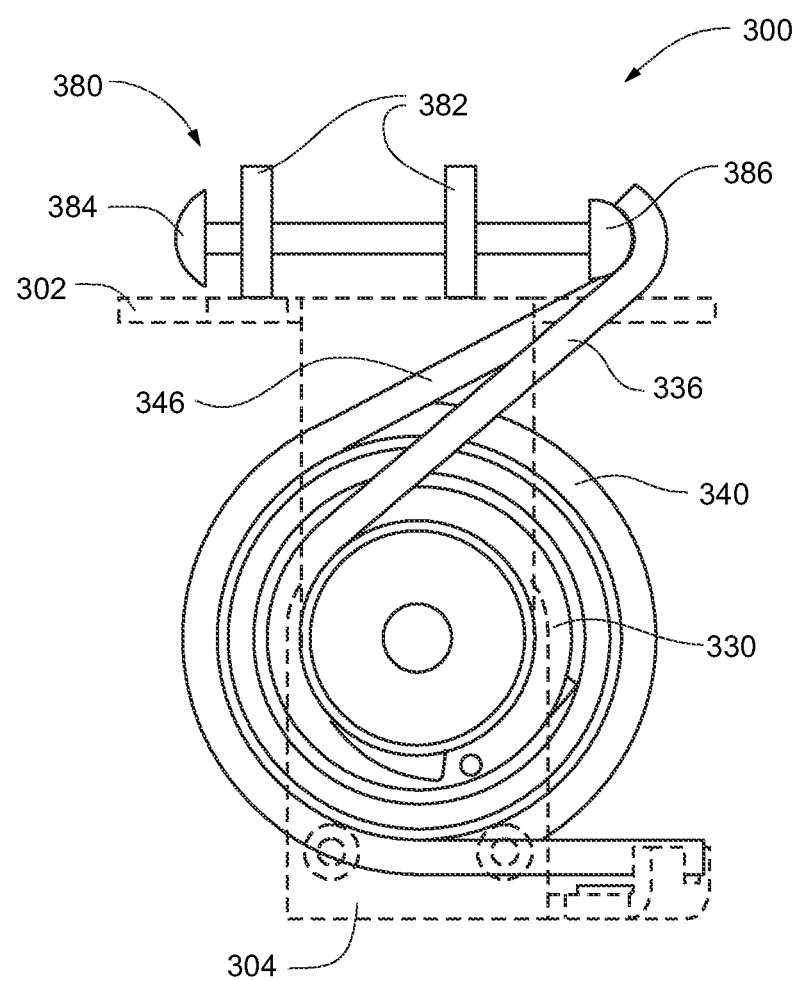
FIG. 7 is a side plan view of a tilt mechanism in a first tilt orientation in accordance with an embodiment of the invention.

According to some embodiments, the first and/or the second springs 230, 240 may engage the first and the second mounting brackets directly or indirectly. For example, as shown in the embodiment in FIGS. 2-6, the ends of the springs 230, 240 directly contact and push against the first and second brackets 202, 204. Turning to FIG. 7, in some embodiments a tilt mechanism 300 includes a torque adjustment mechanism 380 that provides an indirect and adjustable engagement between the springs 330, 340 and the first and/or second mounting brackets 302, 304. In the depicted embodiment, the torque adjustment mechanism 380 is provided by two tabs 382 that secure a threaded screw 384 that can be advanced in and out of the tabs in order to change the tension on the springs. The screw 384 is attached to a plunger 386 that engages both of the first ends of the springs. For example, although not shown in FIG. 7, the plunger may extend longitudinally between the two spring ends and be connected near its middle to the threaded screw 384. Although in this example the plunger engages both of the springs to simultaneously adjust their tension, it is also contemplated that in some cases the torque adjustment mechanism can be configured to only adjust the tension of one of the springs.

The torque adjustment mechanism 380 can be useful for adjusting the pre-loaded torque on one or both springs 330, 340 to accommodate structures coupled to the tilt mechanism of varying weights. As just one example, a user can adjust the torque of the springs shown in FIG. 7 in order to balance the load created by an electronic display moving about the tilt axis 306. In situations in which the display is held relatively closely to the tilt axis, a user may be able to decrease the force provided by the springs to correspond to a relatively small moment arm and thus smaller torque generated by the display. Conversely, in situations in which the display is held at a distance from the tilt mechanism (e.g., the display is coupled to the tilt mechanism through a support arm or the like), a user can adjust the torque adjustment mechanism to increase the force provided by the springs to account for the longer moment arm and increased torque generated by the display.

As described above, some embodiments of the invention provide a positioning apparatus or device incorporating a tilt mechanism such as one of those described above to provide a tilting function for the operator. As described elsewhere, FIG. 1 illustrates one example of an electronic display stand 100 that incorporates a tilt mechanism. FIGS. 8A-8D depict additional examples of display positioning devices that can also incorporate one or more tilt mechanisms such as those described herein. Briefly, FIG. 8A depicts another version of a display stand 800 incorporating a tilt mechanism 802. FIG. 8B illustrates a wall-mounted computer station 804 that incorporates two tilt mechanisms 806, 808, one or more of which may include two nested torsion springs as discussed above. FIG. 8C illustrates a support arm 810 including a tilt mechanism 812 that couples an electronic display mount 814 to the arm. FIG. 8D illustrates an example of a combined notebook and electronic display stand 820 with a support column that includes at least one tilt mechanism 822.

Figure 9A:
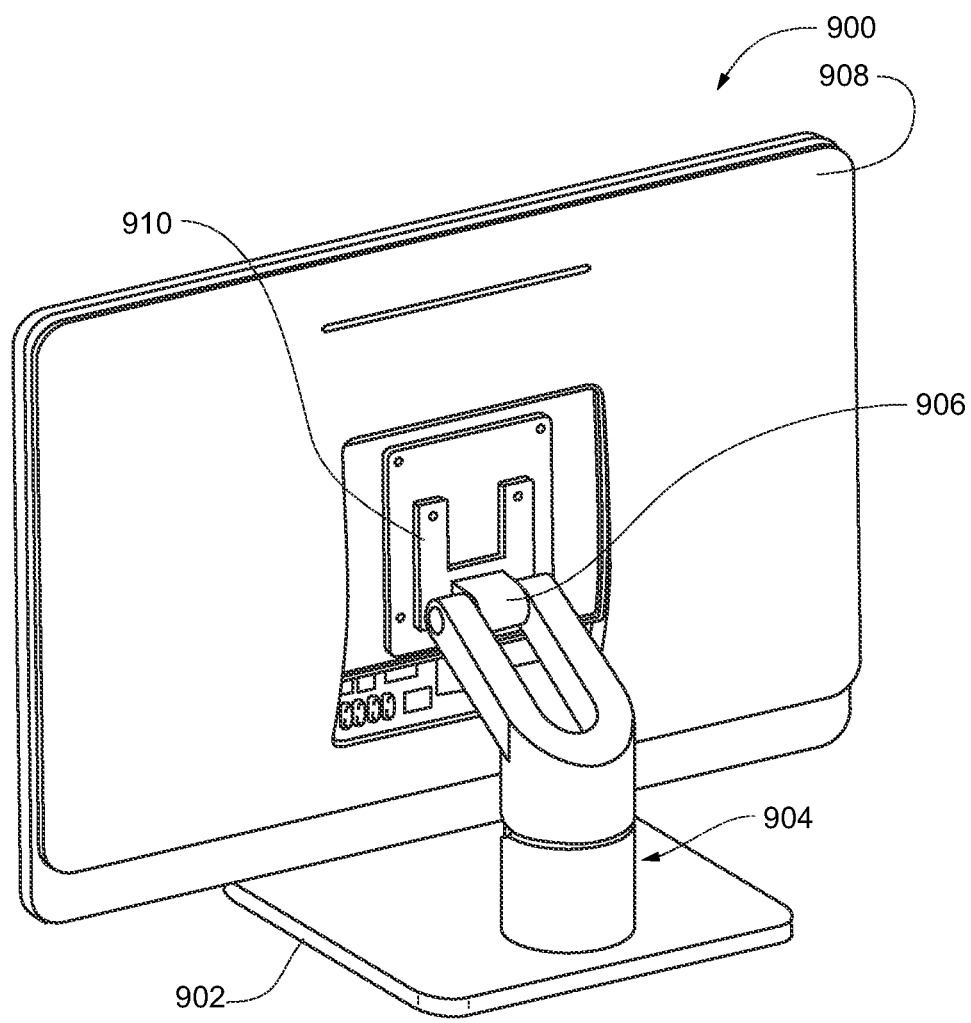
FIG. 9A is a first perspective view of an electronic display stand in accordance with an embodiment of the invention.

FIGS. 9A-9D illustrate another embodiment of an electronic display stand 900 that incorporates two tilt mechanisms. Referring to FIG. 9A, the display stand 900 generally includes a base 902 configured to rest upon a support surface, a support column 904, and a first tilt mechanism 906 that couples an electronic display 908 to the support column 904 via a display mount 910. In some cases the first tilt mechanism 906 may optionally be provided with a nested torsion spring assembly such as is described elsewhere herein, though conventional types of tilt mechanisms may also be used for the first tilt mechanism 906 if desired.

Figure 9B:
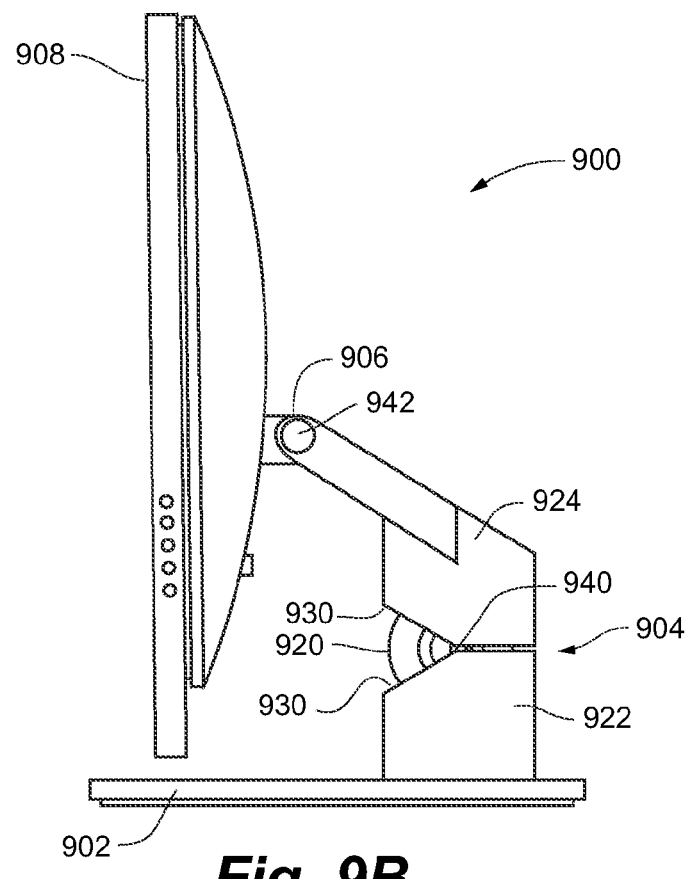
FIG. 9B is a side plan view of the electronic display stand of FIG. 9A with a tilt mechanism in a first tilt orientation in accordance with the embodiment.
Figure 9C:
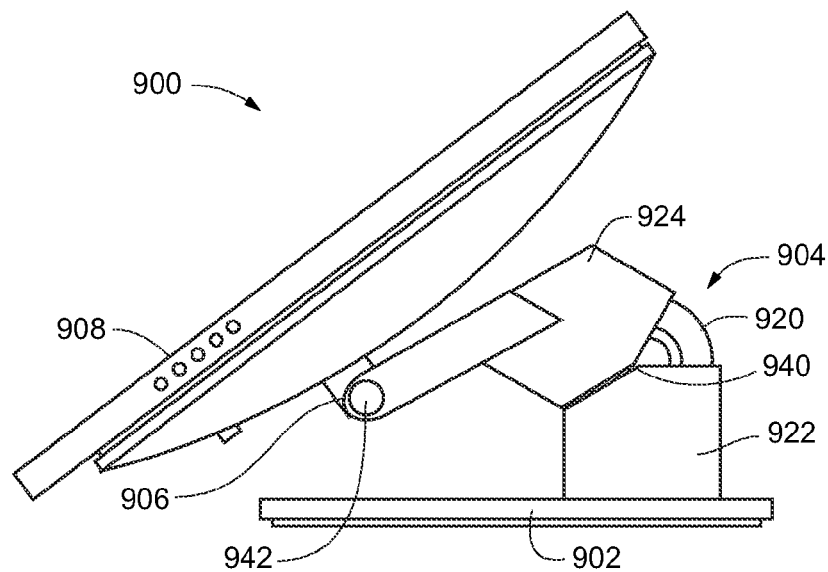
FIG. 9C is a side plan view of the electronic display stand of FIG. 9A with the tilt mechanism in a second tilt orientation in accordance with the embodiment.

Turning to FIGS. 9B and 9C, in this embodiment the support column 904 is provided in two parts that are coupled together by a second tilt mechanism 920. As shown, a first support member 922 is coupled between the base 902 and the second tilt mechanism 920 and a second support member 924 is coupled between the first and the second tilt mechanisms 906, 920. As shown in FIG. 9C, the arrangement of dual tilt mechanisms allows the display stand 900 to provide a position for the display 908 that is forward and near the base 902, which can be useful for bifocal viewing. Portions of the first and the second support members 922, 924 can include cutouts 930 that enable the angular range of motion shown between the orientations in FIGS. 9B and 9C. Rotation of the second support member 924 about a tilt axis 940 of the second tilt mechanism toward the first support member 922 (counter clockwise as shown in FIGS. 9B-9C) pitches the display 908 forward and down with respect to the base 902 while also translating the tilt axis 942 of the first tilt mechanism toward the base 902.

Figure 9D:
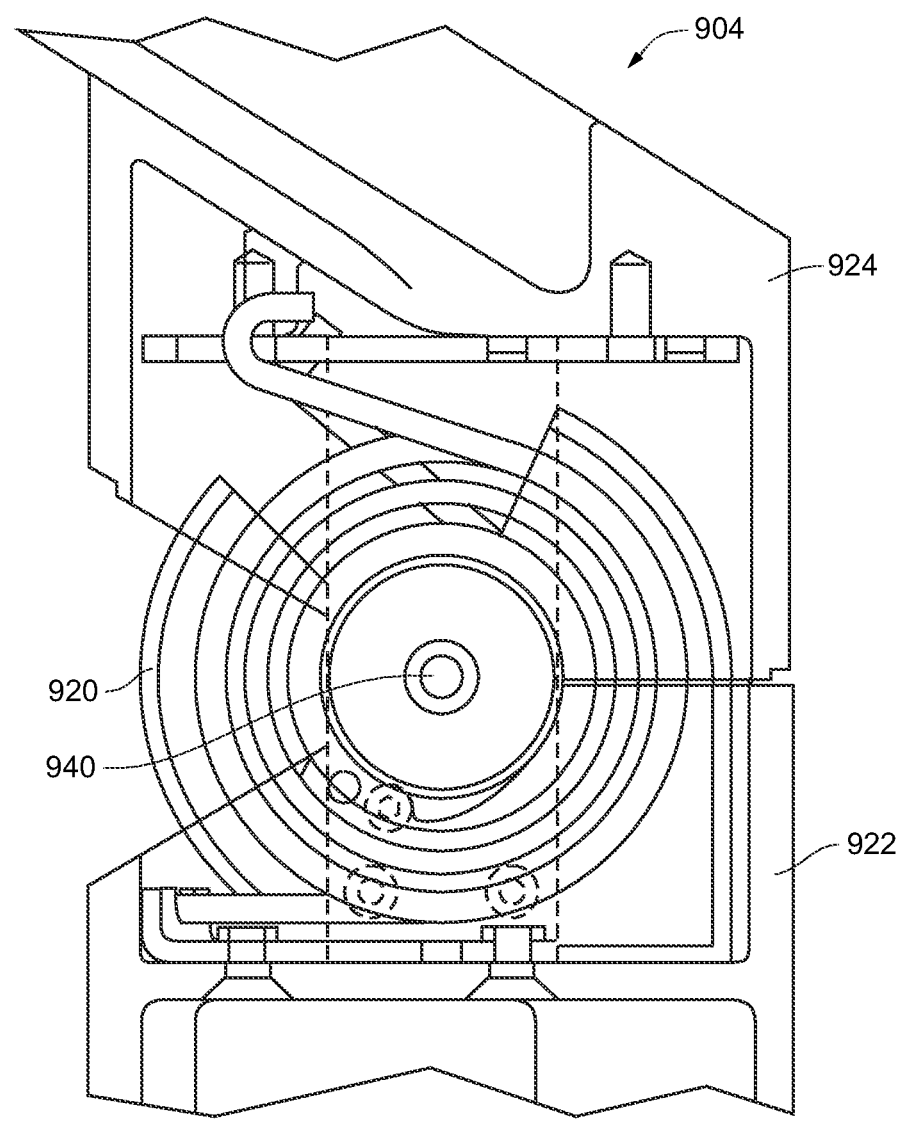
FIG. 9D is a partial side cross-sectional view of the electronic display stand of FIG. 9A in accordance with the embodiment.

FIG. 9D is a partial side cross-sectional view of the support column 904 providing a more detailed view of the second tilt mechanism 920, which in this embodiment is provided by a mechanism similar to the tilt mechanism described above with respect to FIGS. 2-6.

Referring again to the tilt mechanism 200 from FIGS. 2-6 and the tilt mechanism 300 described with respect to FIG. 7, the use of a spring assembly having first and second torsion springs positioned about the tilt axis in a nested configuration can provide a significantly greater spring force acting between the first and second brackets than might be possible with a single, larger spring. Conversely, use of the nested torsion springs can also provide a significantly smaller tilt mechanism that still provides a similar amount of torque to a larger tilt mechanism. As just one example, Applicant has been able to reduce the size of a tilt mechanism by up to 50% using the two nested torsion spring design described herein, while still maintaining sufficient spring forces to counteract and/or balance the weight of a display. This allows the tilt mechanism to not only utilize smaller diameter wire for the springs and shrink the effective diameter of the springs, but also to shorten the effective axial length of the combined springs. This provides a small, compact tilt mechanism that can be incorporated into smaller display stands while still supporting larger electronic displays. Referring to the embodiment in FIGS. 9A-9D, using nested torsion springs for the second tilt mechanism 920 enables the tilt mechanism 920 to be positioned within a cylindrically-shaped support column having a relatively short diameter.

Embodiments of the invention also provide methods for tilting an electronic display using a tilt mechanism such as one of those described herein. According to some embodiments, tilting an electronic display includes moving the electronic display in a first direction about a tilt axis as described above. While moving the display, the user is also rotating a first tilt bracket coupled to the electronic display with respect to a second tilt bracket coupled to a support member. The rotation occurs through a first angular range of motion about the tilt axis as described elsewhere herein. Rotating the tilt bracket loads a first spring wound about the tilt axis with a first torque corresponding to a first portion of the electronic display's weight, and also loads a second spring wound about the first spring and the tilt axis, such that the first spring is located at least partially within the second spring, with a second torque corresponding to a second portion of the electronic display's weight.

In another embodiment, a method may also include moving the electronic display in a second direction about a tilt axis. Such movement can include rotating the first tilt bracket with respect to the second tilt bracket through a second angular range of motion about the tilt axis in a direction opposite from the rotating through the first angular range of motion. The rotating of the brackets exerts a third torque between the first and the second tilt brackets as the first spring unloads its tension to counteract a corresponding portion of the electronic display's weight. The rotation also exerts a fourth torque between the first and the second tilt brackets as the second spring unloads its tension to counteract a corresponding portion of the electronic display's weight.

As discussed with the embodiment shown in FIGS. 9A-9D, in some cases one or more parts may be tilted or translated with respect to a tilt mechanism depending upon the structural relationship between the parts. For example, in some cases moving an electronic display in a first direction about the tilt axis and moving the electronic display in the second direction about the tilt axis each comprises tilting the electronic display with respect to the tilt axis. In some cases moving the electronic display in the first direction about the tilt axis and moving the electronic display in the second direction about the tilt axis each comprises translating the electronic display with respect to the tilt axis. Some embodiments may also provide methods for adjusting a tension of at least one of the first spring and the second spring in a tilt mechanism as also described herein.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. An apparatus, comprising:
an electronic display mount configured to couple to and support an electronic display;
a support member for supporting the electronic display mount with respect to a support surface; and
a tilt mechanism coupled between the electronic display mount and the support member, the tilt mechanism comprising:
a first bracket coupled to the electronic display mount;
a second bracket coupled to the support member and pivotally coupled to the first bracket about a tilt axis;
a first spring wound about the tilt axis and comprising a first end engaged with the first bracket and a second end engaged with the second bracket, the first spring exerting a first torque between the first and the second brackets in a first direction about the tilt axis; and
a second spring wound about the first spring and the tilt axis such that the first spring is located at least partially within the second spring, the second spring comprising a first end engaged with the first bracket and a second end engaged with the second bracket, the second spring exerting a second torque between the first and the second brackets in the first direction about the tilt axis.

2. The apparatus of claim 1, further comprising a first mandrel located within the first spring and a second mandrel located between the first spring and the second spring so that the first spring is at least partially within the second mandrel.

3. The apparatus of claim 1, wherein the first spring and the second spring are helical torsion springs concentric about the tilt axis.

4. The apparatus of claim 1, further comprising a torque adjustment mechanism configured to provide an adjustable engagement between the first bracket and at least one of the first end of the first spring and the first end of the second spring.

5. The apparatus of claim 4, wherein the torque adjustment mechanism comprises an adjustable screw and a plunger that engages the first ends of both the first and the second springs.

6. The apparatus of claim 1, wherein the first bracket and the second bracket are coupled to a shaft coaxial with the tilt axis to provide an angular range of motion between the first bracket and the second bracket of less than one rotation about the tilt axis.

7. The apparatus of claim 1, wherein the support member comprises at least one of a support column, a support arm, a wall mount, and a riser.

8. The apparatus of claim 1, wherein the support member is a first support member, the tilt mechanism is a first tilt mechanism, and further comprising:
a base configured to rest upon the support surface, wherein the first support member is coupled between the base and the first tilt mechanism;
a second tilt mechanism coupled between the first tilt mechanism and the electronic display mount; and
a second support member coupled between the first tilt mechanism and the second tilt mechanism;
wherein rotation of the first bracket about the tilt axis toward the second bracket of the first tilt mechanism translates the second tilt mechanism toward the base.

9. A method for tilting an electronic display coupled to a support member by a tilt mechanism, the method comprising:
providing the tilt mechanism, the tilt mechanism including:
a first bracket coupled to the electronic display mount;
a second bracket coupled to the support member and pivotally coupled to the first bracket about a tilt axis;
a first spring wound about the tilt axis and comprising a first end engaged with the first bracket and a second end engaged with the second bracket; and
a second spring wound about the first spring and the tilt axis such that the first spring is located at least partially within the second spring, the second spring comprising a first end engaged with the first bracket and a second end engaged with the second bracket;
moving the electronic display in a first direction about a tilt axis, comprising:
rotating the first tilt bracket coupled to the electronic display through a first angular range of motion about the tilt axis with respect to a second tilt bracket coupled to the support member;
loading the first spring wound about the tilt axis with a first torque corresponding to a first portion of the electronic display's weight;
loading the second spring wound about the first spring and the tilt axis, such that the first spring is located at least partially within the second spring, with a second torque corresponding to a second portion of the electronic display's weight.

10. The method of claim 9, further comprising moving the electronic display in a second direction about a tilt axis, comprising:
rotating the first tilt bracket with respect to the second tilt bracket through a second angular range of motion about the tilt axis in a direction opposite from the rotating through the first angular range of motion;
exerting a third torque between the first and the second tilt brackets with the first spring to counteract a corresponding portion of the electronic display's weight; and
exerting a fourth torque between the first and the second tilt brackets with the second spring to counteract a corresponding portion of the electronic display's weight.

11. The method of claim 10, wherein moving the electronic display in the first direction about the tilt axis and moving the electronic display in the second direction about the tilt axis each comprises tilting the electronic display with respect to the tilt axis.

12. The method of claim 10, wherein moving the electronic display in the first direction about the tilt axis and moving the electronic display in the second direction about the tilt axis each comprises translating the electronic display with respect to the tilt axis.

13. The method of claim 10, further comprising adjusting a tension of at least one of the first spring and the second spring.

14. An apparatus, comprising:
an electronic display mount configured to couple to and support an electronic display;
a first support member for supporting the electronic display mount with respect to a support surface; and
a first tilt mechanism coupled between the electronic display mount and the first support member, the first tilt mechanism comprising:
a fist bracket coupled to the electronic display mount;
a second bracket coupled to the first support member and pivotally coupled to the first bracket about a tilt axis;
a first spring wound about the tilt axis and comprising a first end engaged with the first bracket and a second end engaged with the second bracket, the first spring exerting a first torque between the first and the second brackets in a first direction about the tilt axis; and
a second spring wound about the first spring and the tilt axis such that the first spring is located at least partially within the second spring, the second spring comprising a first end engaged with the first bracket and a second end engaged with the second bracket, the second spring exerting a second torque between the first and the second brackets in the first direction about the tilt axis;
a base configured to rest upon the support surface, wherein the first support member is coupled between the base and the first tilt mechanism;
a second tilt mechanism coupled between the first tilt mechanism and the electronic display mount; and
a second support member coupled between the first tilt mechanism and the second tilt mechanism,
wherein rotation of the first bracket about tilt axis toward the second bracket of the first tilt mechanism translates the second tilt mechanism toward the base.

\* \* \* \* \*

UNITED STATES PATENT AND TRADEMARK OFFICE
CERTIFICATE OF CORRECTION

PATENT NO. : 9,155,235 B2
APPLICATION NO. : 13/754428
DATED : October 6, 2015
INVENTOR(S) : Lindblad et al.

Page 1 of 1

It is certified that error appears in the above-identified patent and that said Letters Patent is hereby corrected as shown below:

In the specification

Column 3, line 30, delete "104." and insert --106.--, therefor

Column 3, line 42, delete "104" and insert --106--, therefor

Column 3, line 42, delete "102." and insert --104.--, therefor

In the claims

Column 12, line 6, Claim 14, delete "fist" and insert --first--, therefor

Column 12, line 29, Claim 14, before "tilt", insert --the--, therefor

Signed and Sealed this
Fourteenth Day of June, 2016

Michelle K. Lee
*Director of the United States Patent and Trademark Office*